(12) United States Patent
Kirichenko

(10) Patent No.: US 7,944,253 B1
(45) Date of Patent: *May 17, 2011

(54) DIGITAL PROGRAMMABLE FREQUENCY DIVIDER

(75) Inventor: Alexander F. Kirichenko, Pleasantville, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/494,876

(22) Filed: Jun. 30, 2009

Related U.S. Application Data

(63) Continuation of application No. 11/943,798, filed on Nov. 21, 2007, now Pat. No. 7,554,369, which is a continuation-in-part of application No. 11/243,022, filed on Oct. 4, 2005, now abandoned.

(51) Int. Cl.
*H03B 19/00* (2006.01)

(52) U.S. Cl. .......................... 327/117; 327/118; 327/119

(58) Field of Classification Search .................. None
See application file for complete search history.

(56) References Cited

U.S. PATENT DOCUMENTS 6,781,435 B1 * 8/2004 Gupta et al. .................. 327/407

* cited by examiner

*Primary Examiner* — An T Luu
(74) *Attorney, Agent, or Firm* — Steven M. Hoffberg; Ostrolenk Faber LLP

(57) ABSTRACT

A digital programmable frequency divider is constructed of Rapid Single Flux Quantum (RSFQ) logic elements. The logic elements may include an RSFQ non-destructive readout cell (NDRO), RSFQ D flip-flop and an RSFQ T flip-flop. A digital word comprising N bits is used to control the amount of frequency division and the frequency divider selectively imparts a respective frequency division for any of $2^n$ states that can be represented by the digital word. The RSFQ logic elements utilize Josephson junctions which operate in superconducting temperature domains.

20 Claims, 7 Drawing Sheets

DIGITAL PROGRAMMABLE FREQUENCY DIVIDER

CROSS REFERENCE TO RELATED APPLICATIONS

This application is a continuation of U.S. patent application Ser. No. 11/943,798, filed Nov. 21, 2007, now U.S. Pat. No. 7,554,369, issued Jun. 30, 2009, which is a continuation in part of U.S. patent application Ser. No. 11/243,022, filed Oct. 4, 2005 now abandoned, entitled A Digital Programmable Frequency Divider by inventor Alexander Kirichenko, each of which is hereby incorporated by reference in its entirety.

STATEMENT REGARDING FEDERALLY FUNDED RESEARCH

This invention was made with Government support under Contract number N00014-03-C-0082 awarded by the Department of the Navy. The Government has certain rights in the invention.

BACKGROUND OF THE INVENTION

1. Field of the Invention

The invention described herein relates to the field of superconductivity, and more specifically relates to circuits and techniques for implementing a precise digital frequency divider using Josephson junctions.

2. Related Art

Josephson junctions are quantum-mechanical circuit elements of superconducting devices. The Josephson effect in particular results from two superconductors acting to preserve long-range order across a barrier, such as an insulating barrier. With a thin enough barrier, the phase of the electron wave function in one superconductor maintains a fixed relationship with the phase of the wave function in another superconductor. This linking up of phases is called phase coherence.

A Josephson junction is the interface between two superconducting materials separated by a non-superconducting barrier. A current may flow freely within the superconductors but the barrier prevents the current from flowing freely between them. However, a supercurrent may tunnel through the barrier depending on the quantum phase of the superconductors. The amount of supercurrent that may tunnel through the barriers is restricted by the size and substance of the barrier. The maximum value the supercurrent may obtain is called a critical current of the Josephson junction.

Josephson junctions have two basic electrical properties. The first is that the junctions have inductive reactance. That is, similar to inductors, the voltage difference across the junction is related to the time rate of change of the current. The second is that a constant voltage across the junction will produce an oscillating current through the barrier, and vice versa. Thus, Josephson junctions convert a direct current voltage to an alternating current.

A family of logic/memory devices were proposed using Josephson junctions in the IEEE Transactions on Applied Superconductivity, Volume 1, Number 1, March 1991, by K. K. Likharev and V. K. Semenov in an article entitled, RSFQ Logic/Memory Family: A New Josephson Junction Technology For Sub-Terahertz-Clock-Frequency Digital Systems. That article is hereby incorporated by reference in its entirety into specification of this application.

RSFQ circuits are widely recognized as the fastest digital circuits in any electronic technology, and this is also true of RSFQ digital frequency dividers of the prior art. However, the circuits of the prior art were severely limited in their ability to vary the frequency division ratio. In the circuit of the proposed invention, the frequency division ratio may be varied under program control from 1 to 2n, creating a circuit that is both versatile and ultrafast.

BRIEF SUMMARY OF THE INVENTION

The invention described herein is related to circuits and techniques for implementing a digital programmable frequency divider utilizing Josephson junction technology.

The purpose of the invention is to provide a digital programmable frequency divider, which overcomes the problems of the prior art.

DETAILED DESCRIPTION OF THE INVENTION

Figure 1:
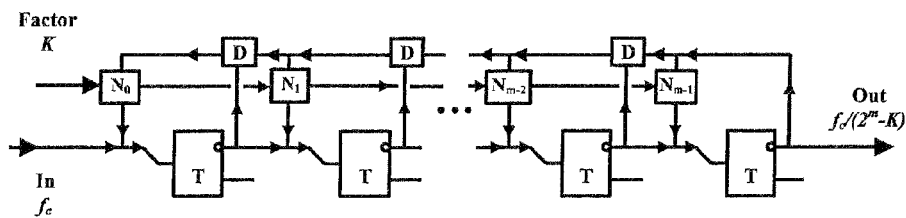
FIG. 1 is a block diagram of a programmable digital frequency divider in accordance with one aspect of the invention.

FIG. 1 is a block diagram of a digital programmable frequency divider (PFD) in accordance with one aspect of the invention. A programmable local oscillator (PLO) is a very useful part of many digital processing systems. The traditional way of producing a pulse signal of needed frequency is to divide a high-frequency reference signal by a certain factor. Previously suggested Rapid Single Flux Quantum (RSFQ) clock dividers were able to decimate only by factors of $2^n$. The frequency divider of the invention is capable of dividing the input signal frequency by any natural number from 1 to $2^n$, where n is the number of bits (the length of the circuit).

The frequency divider consists of basic RSFQ cells: T flip-flops (designated as T), D flip-flops (designated as D), and Non-Destructive Read-Out cells (NDRO) or alternative DC-driven switches (designated as K).

The functionality of the Programmable Frequency Divider is rather complex. When all n switches are OFF (digital word K=0), it works as a regular ripple counter, dividing the input frequency by a factor of $2^n$. Let us consider the case where we close only the last switch (K=$2^n$−1). Now, the output pulse loops back to the last T flip-flop, setting it to the initial state. Thus, the last flip-flop becomes effectively shunted and does not participate in the decimation process. So the dividing factor becomes $2^n$−1. Next, let us consider a slightly more complicated case, when we close only the first switch (K=1). Now, the decimated output SFQ pulse moves through the pipeline structure to shunt the first T flip-flop. For every $2^n$-th input SFQ pulse, the first T flip-flop idles its cycle, remaining in the initial state. Thus instead of $2^n$, we obtain a decimation factor $2^n$−1. This can be extrapolated for any given number K from 0 to $2^n$−1, or decimation factor from 1 to $2^n$. The most complicated case is when all switches are shorted (K=$2^n$−1). In this case, every T flip-flop is "shunted" with a loopback. None of them divides the input signal, thus propagating it to the output without decimation.

Figure 2:
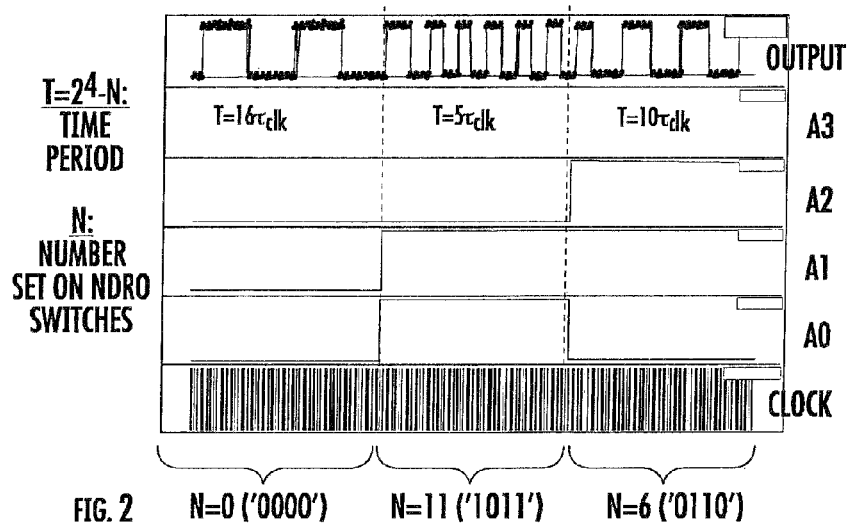
FIG. 2 shows the experimentally obtained output wave forms from the divider of FIG. 1 having as a digital control word or binary representation of the decimal divider factor 0, 11 and 6, changing with time, and the wave form of the clock of FIG. 1.

FIG. 2 illustrates the operation of the circuit shown in FIG. 1. This is experimentally obtained data. The CLOCK portion of FIG. 2 shows the reference clock applied to the input of the chain of toggle flip-flops. The output line shows the frequency of the output under circumstances where the divisor factor ($N_0 \ldots N_{n-1}$) changes from a binary value of N=0, to N=11, to N=6. As the value of the divisor factor changes, the frequency changes from 16 clock periods ($16\tau_{clk}$) per cycle to 5 clock periods per cycle to 10 clock periods per cycle, respectively.

Figure 3A:
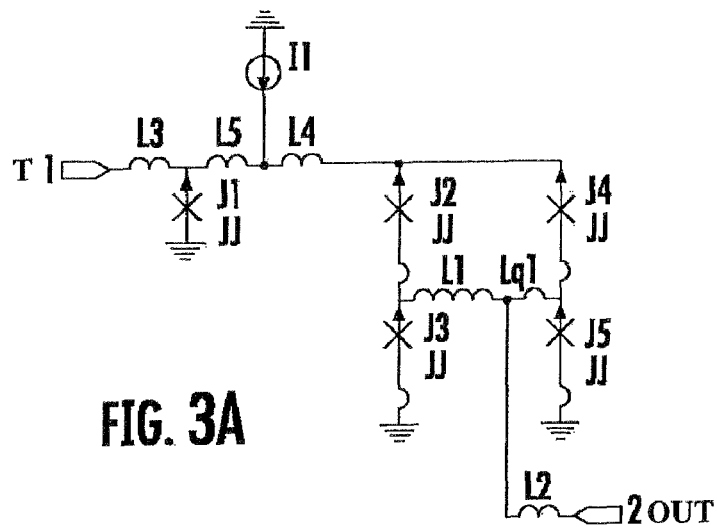
FIG. 3A shows a circuit for an SFQ toggling flip-flop (TFF) as used in the circuit of FIG. 1.

FIG. 3A shows a circuit for construction of an SFQ toggle flip-flop as used in the construction of the circuit of FIG. 1. The operation of this latch is identical to that of an RS flip-flop trigger with joined set and reset inputs. The T flip-flop has 2 stable states: "1" and "0", that is, with and without a magnetic flux quantum stored inside a loop. Every input pulse "T" triggers switching of the latch to the opposite state. When it is in state "0" an incoming SFQ pulse at port "1" switches the T flip-flop to the state "1". When the latch is in state "1" an SFQ pulse at input "1" switches the flip-flop to state "0". The transition "1"→"0" results in appearance of an SFQ pulse at the output "2." Note that the frequency of the output pulses is exactly ½ of the frequency of the input pulses. The normalized PSCAN units are normalized to 125 µA for junction critical currents J and bias current values I and to 2.63 pH for inductance values L.

The values of the normalized units for FIG. 3A are J1=2.02, J2=2.46, J3=1.31, J4=1.00, J5=2.04, I1=2.02, L1=1.91, L2=1.80, L3=0.65, L4=0.20, L5=0.16, LQ1=0.16, LJ1=0.11, LJ2=0.30, LJ3=0.06, LJ4=0.15, LJ5=0.07, XST=0.00.

Figure 3B:
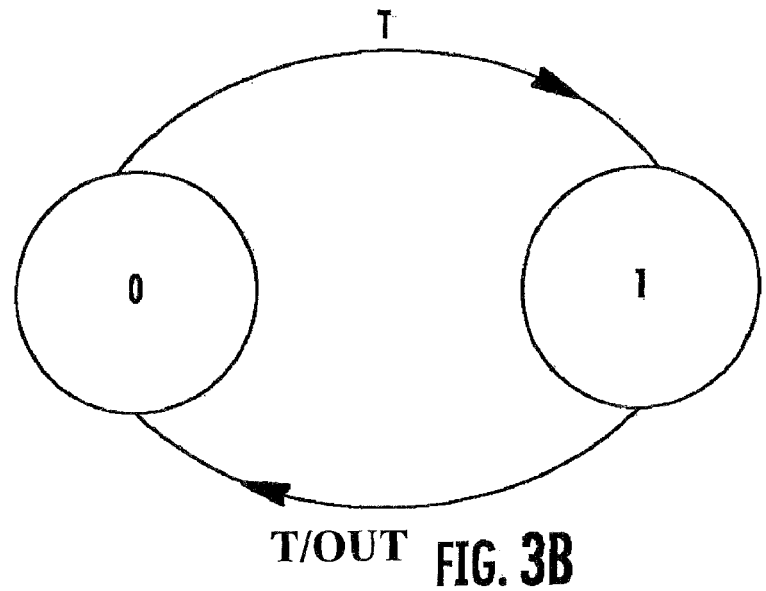
FIG. 3B shows a Moore diagram of the SFQ toggle flip-flop used in FIG. 1.

FIG. 3B shows a Moore diagram of the SFQ T flip-flop used in FIG. 1.

Figure 4A:
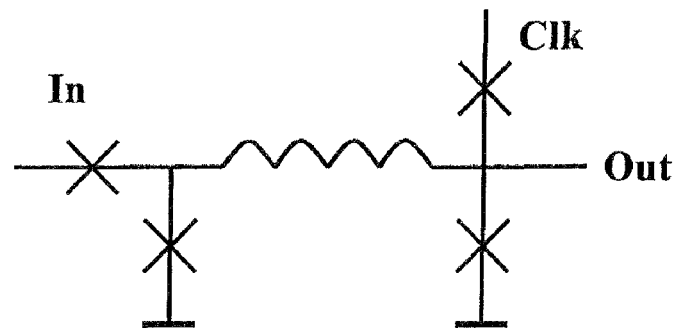
FIG. 4A shows a circuit for an SFQ D flip-flop as used in the circuit of Figure

FIG. 4A shows a circuit for an SFQ D flip-flop as used in the construction of the circuit of FIG. 1.

Figure 4B:
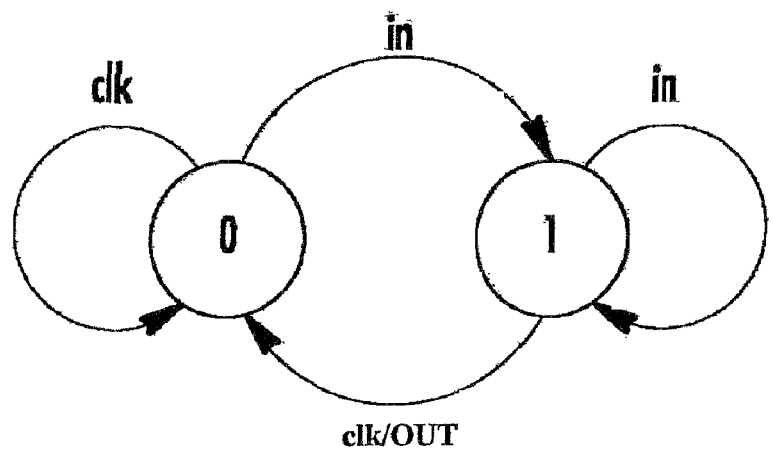
FIG. 4B shows a Moore diagram of the SFQ D flip-flop shown in FIG. 4A.

FIG. 4B shows a Moore diagram of the D flip-flop used in FIG. 1.

Figure 5A:
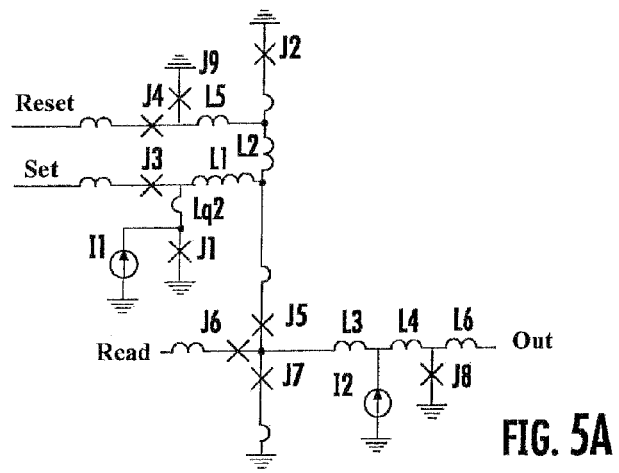
FIG. 5A shows a circuit for an SFQ NDRO element used in the circuit of FIG. 1.

FIG. 5A shows a circuit for construction of an SFQ NDRO (non-destructive readout) cell. This logic cell that functions as a Non-Destructive Read-Out with a single bit memory. One can change the state of the NDRO by applying the Reset or Set inputs. If the cell is in state "1", then the Read input goes to the Output. If the cell is in state "0", then the Read input pulse is prevented from going to the Output. This is a T flip-flop based NDRO cell. The normalized PSCAN values for the circuit of FIG. 5A are as follows: J1=2.26, J2=1.78, J3=2.05, J4=1.50, J5=1.45, J6=2.39, J7=2.36, J8=2.89, J9=1.50, I1=1.95, I2=3.15, LQ2=0.10, L1=1.01, L2=0.42, L3=0.58, L4=0.57, L5=0.37, L6=0.80, L7=0.51, LJ2=1.23, LJ3=0.53, LJ4=0.15, LJ5=0.11, LJ6=0.40, LJ7=0.21, LJ9=0.13.

Figure 5B:
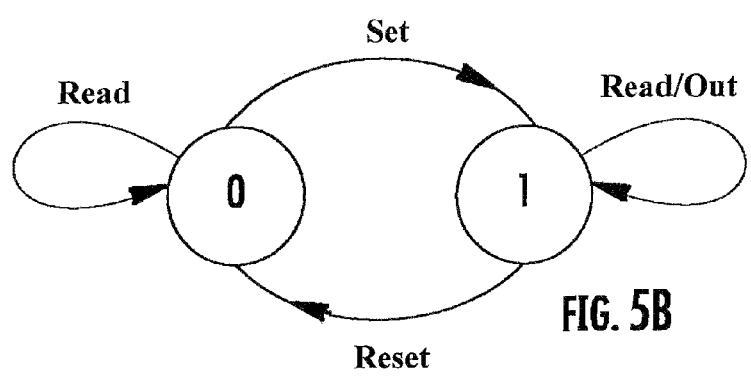
FIG. 5B shows a Moore diagram for an SFQ NDRO circuit of the type shown in FIG. 5A.
Figure 6A:
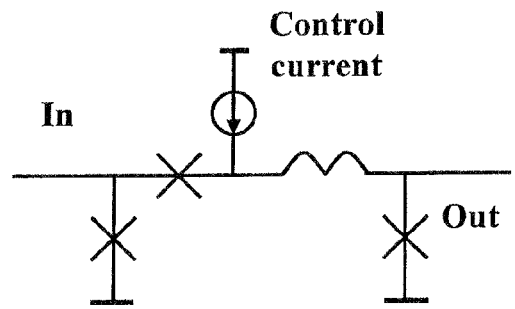
FIG. 6A is a D.C. switch that can be utilized as an alternative to the SFQ NDRO for some applications.

FIG. 5B shows a Moore diagram of the SFQ NDRO cell used in FIG. 1. The normalized PSCAN values for the circuit of FIG. 6A are as follows: J1=1.52, J2=1.75, L1=0.31, L2=0.45.

Figure 6B:
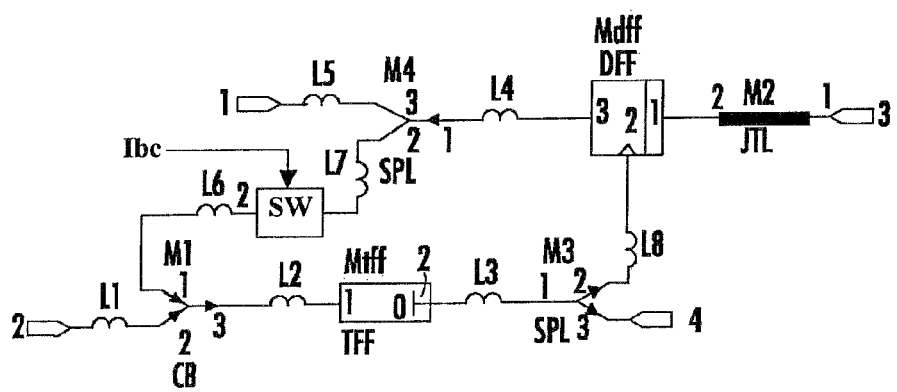
FIG. 6B is an alternative cell construction for the circuit of FIG. 1 which uses a D.C. switch in lieu of a TFF-type NDRO.

FIG. 6A is a D.C. switch that can be utilized as an alternative to the SFQ NDRO cell for some applications. This circuit passes or blocks propagation of an SFQ pulse. If a DC current is applied, the switch is "ON" and any pulse at the input propagates through the switch. If the DC current is not applied, the switch is "OF", and the pulse is prevented from propagating through the switch. Using this configuration, the circuit of FIG. 6A will be used in place of the switch-element shown in FIG. 6B. The D flip-flop (DFF) and the T flip-flop (TFF) function as the corresponding circuit shown in FIG. 1.

Figure 7:
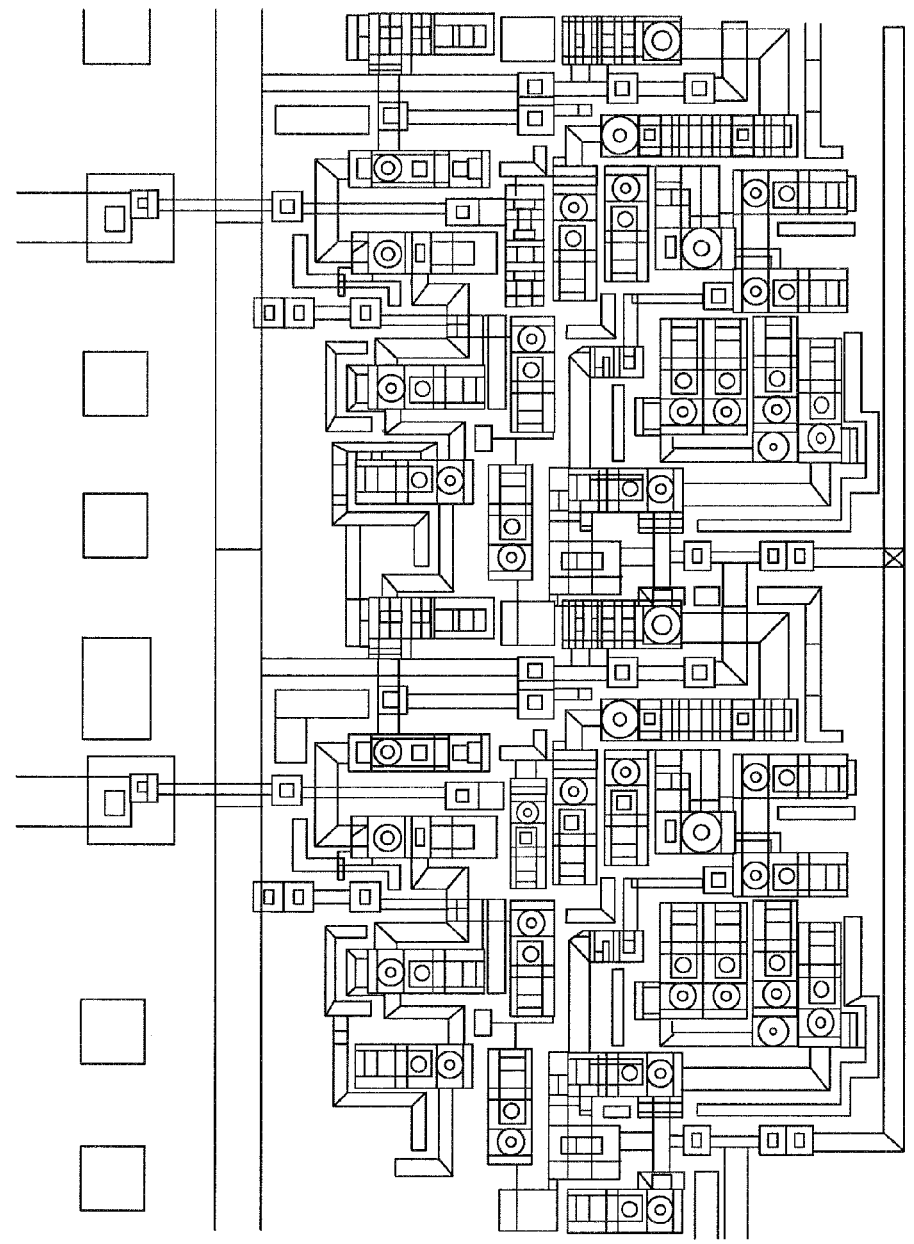
FIG. 7 is an exemplary layout of a cell of digital programmable frequency divider in accordance with one aspect of the invention.

FIG. 7 shows an exemplary layout of a cell of a programmable frequency divider in accordance with one aspect of the invention, designed for HYPRES's standard fabrication process. The size of a single stage of the PFD is 150 µm×150 µm for HYPRES's old 3-µm design rules. This fragment is of the parallel version of the PFD. Two programmable frequency dividers were built for testing: a 4-bit (short) version for low-speed (functionality) testing and a 10-bit for high-speed testing. As tested, the 4-bit PFD, decimates the input clock pulses by a factor of 16 for K=0, by 5 for K=1, and by 10 for K=6. It takes 16 ($2^n$) clock pulses for transitioning from one frequency to another. This number of clock pulses is needed to clean up the shift register. We have checked DC bias current margins for all 16 numbers. The minimal margin was 8% for K=15 and the maximum margin was 22% for K=0.

A high-speed test was performed on a 10-bit PFD. We used a 50-GHz Agilent 83 650B generator for the input signal and monitored the output on a Tektronix TDS694C oscilloscope. The results of this test for 30.72 GHz input frequency are that the programmable frequency divider was operational within 18% DC bias current margins at decimation factor 1024 (K=0) and within 3% at decimation factor 500 (K=524). Because of a toggle-type SFQ-to-DC converter, there is an additional factor of 2 in frequency reduction at the output. Also, the low level of the signal and the phase noise from the amplifier caused slight (less than 0.01%) deviation of the measured frequency from the expected frequency.

Figure 8:
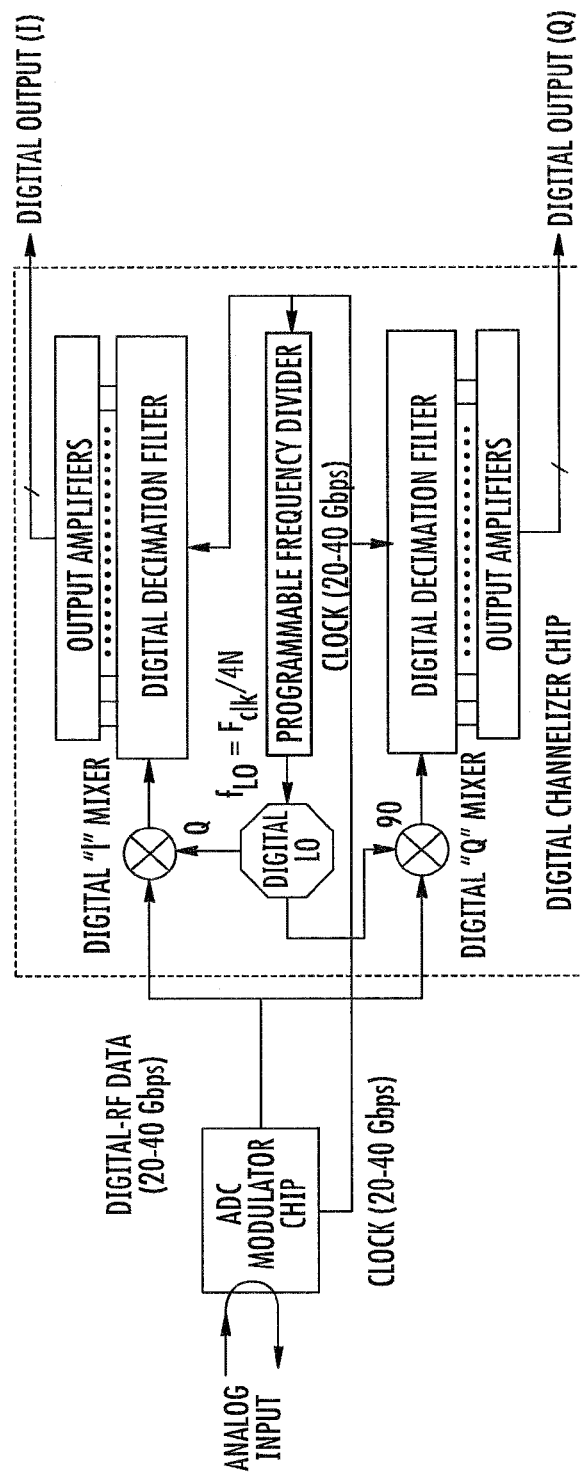
FIG. 8 shows the use of the programmable frequency divider in a digital channelizer chip in accordance with one aspect of the invention.

FIG. 8 shows the use of the programmable frequency divider in the digital channelizer chip or unit in accordance with one aspect of the invention. The programmable divider of the invention is used to produce a digital local oscillator (LO) at integer submultiple frequencies of a master or recovered clock to feed into the digital mixer of the channelizer chip or unit as shown in FIG. 8. The signal input to the mixers comes from an ADC Modulator chip, such as an over sampled Delta Sigma modulator. This configuration allows down conversion to occur in selected (programmable) bands.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A digital programmable frequency divider comprising a plurality of Single Flux Quantum (SFQ) logic elements having an input adapted to receive a multibit digital word having at least two possible states, an input adapted to receive a signal having a frequency, and at least one output, said digital programmable frequency divider being configured to produce at said output a divided frequency corresponding to said received signal divided by said received multibit digital word.

2. The digital programmable frequency divider according to claim 1, in which the Single Flux Quantum logic comprises at least one Rapid Single Flux Quantum (RSFQ) T flip-flop, each having at least one input and at least one output, wherein an output of a T flip-flop is selectively routed to the input of the respective T flip-flop via at least one D-flip-flop.

3. The digital programmable frequency divider according to claim 2, in which a plurality of RSFQ T flip-flops are connected in series.

4. The digital programmable frequency divider according to claim 2, in which a clock input of a D-flip-flop is connected to the output of an associated T-flip-flop, and an output of said D-flip-flop is connected to the input of said T-flip-flop through a nondestructive readout (NDRO) cell.

5. The digital programmable frequency divider according to claim 4, in which a plurality of the NDRO cells forming a register receive said multibit digital word specifying the divisor factor for the frequency divider and in which bits of said digital word are stored in respective NDRO cells.

6. The digital programmable frequency divider according to claim 4, in which each D flip-flop is connected in series with other D flip-flop.

7. The digital programmable frequency divider according to claim 2, in which a clock input of a D-flip-flop is connected to the output of an associated T-flip-flop, and an output of said D-flip-flop is connected to the input of said T-flip-flop through a DC-driven switch.

8. The digital programmable frequency divider according to claim 5, in which said multibit digital word comprises N bits, and said digital programmable frequency divider selectively divides a frequency of said received signal by any natural number that can be represented by said N-bits of said multibit digital word.

9. The digital programmable frequency divider according to claim 1, in which the Single Flux Quantum logic elements comprise Josephson junctions.

10. The digital programmable frequency divider according to claim 1, in which the divided frequency is fed to a digital local oscillator.

11. The digital programmable frequency divider according to claim 1, in which the divided frequency is fed to a digital channelizing unit with programmable band converter.

12. A method for selective frequency division by any natural number, comprising the steps of:
providing a plurality of Single Flux Quantum (SFQ) logic elements configured to receive a multibit digital word having at least two possible states, receive a signal having a frequency, and to produce at an output a divided frequency corresponding to said received signal divided by said received multibit digital word;
applying a source having a frequency as an input to the Single Flux Quantum logic cell;
selectively dividing the frequency of the received signal in selective dependence on a state of the received multibit digital word; and
outputting the selectively divided frequency.

13. The method according to claim 12, in which a group of SFQ logic elements form a cell, a plurality of corresponding cells being connected in series with the output of one cell connected to the input of another cell.

14. The method according to claim 13, in which a cell comprises an SFQ T flip flop, an SFQ non-destructive read out cell and an SFQ D flip flop.

15. A programmable digital frequency divider implemented in a circuit comprising Single Flux Quantum (SFQ) logic elements comprising flip-flops, having a first input which receives an N-bit digital word, a second input which receives a digital signal having a frequency, and a digital output representing a second input selectively divided by the first input, wherein a divide ratio of the programmable digital frequency divider is alterable by changing the N-bit digital word received at the first input.

16. The programmable digital frequency divider according to claim 15, wherein said N-bit digital word is stored in a register comprising a plurality of non-destructive readout (NDRO) cells connected in series.

17. The digital programmable frequency divider according to claim 16, in which said frequency divider selectively divides the frequency of the digital signal by any of the $2^N$ states that can be represented by said N-bit digital word.

18. The digital programmable frequency divider according to claim 15, in which the SFQ logic elements comprise a plurality of cells each having at least one T flip-flop having at least one input and at least one output, wherein data from an output is selectively routed to an input of a respective T flip-flop via at least one D-flip-flop.

19. The digital programmable frequency divider according to claim 18, wherein said D flip-flops of respective cells are interconnected in series.

20. The digital programmable frequency divider according to claim 18, in which a cell is configures such that a clock input of said D-flip-flop is connected to said output of a T-flip-flop, and said output of said D-flip-flop is connected to said input of said T-flip-flop through a nondestructive readout (NDRO) cell.

\* \* \* \* \*